(12) United States Patent
Chu et al.

(10) Patent No.: US 9,424,386 B2
(45) Date of Patent: Aug. 23, 2016

(54) GENERATING PLACE AND ROUTE ABSTRACTS

(71) Applicant: International Business Machines Corporation, Armonk, NY (US)

(72) Inventors: Albert M. Chu, Nashua, NH (US); Lars W. Liebmann, Poughquag, NY (US)

(73) Assignee: International Business Machines Corporation, Armonk, NY (US)

( * ) Notice: Subject to any disclaimer, the term of this patent is extended or adjusted under 35 U.S.C. 154(b) by 27 days.

(21) Appl. No.: 14/548,563

(22) Filed: Nov. 20, 2014

(65) Prior Publication Data

US 2016/0147925 A1    May 26, 2016

(51) Int. Cl.
*G06F 17/50* (2006.01)
(52) U.S. Cl.
CPC ........ *G06F 17/5072* (2013.01); *G06F 17/5068* (2013.01); *G06F 17/5077* (2013.01)
(58) Field of Classification Search
CPC ............ G06F 17/5072; G06F 17/5077; G06F 17/5068
See application file for complete search history.

(56) References Cited

U.S. PATENT DOCUMENTS

| | | | | |
|---|---|---|---|---|
| 7,581,197 B2* | 8/2009 | Arunachalam | ..... | G06F 17/5072 716/119 |
| 7,685,545 B2* | 3/2010 | Chapman | ............ | G06F 17/5045 716/136 |
| 8,370,786 B1* | 2/2013 | Burstein | ............. | G06F 17/5068 716/110 |
| 8,555,232 B2* | 10/2013 | Vats | .................... | G06F 17/5077 716/110 |
| 8,788,988 B2* | 7/2014 | Reed | .................... | G06F 17/5068 716/102 |
| 8,954,914 B2* | 2/2015 | Badar | ................. | G06F 17/5068 716/104 |
| 9,038,004 B2* | 5/2015 | Ford | .................... | G06F 17/5045 716/102 |
| 2009/0019413 A1* | 1/2009 | Kobayashi | .......... | G06F 17/5072 716/119 |
| 2010/0138803 A1* | 6/2010 | Minamiyama | ...... | G06F 17/5068 716/118 |
| 2012/0221994 A1* | 8/2012 | Vats | .................... | G06F 17/5077 716/130 |

OTHER PUBLICATIONS

Vaidyanathan, et al., "Design and Manufacturability Tradeoffs in Unidirectional & Bidirectional Standard Cell Layouts in 14 nm node", Proc. of SPIE, Mar. 2012, 12 pages, vol. 8327, Design for Manufacturability through Design-Process Integration VI, SPIEDigitalLibrary.org (online), doi: 10.1117/12.916104.
Gold, et al., "A Quantitative Approach to Nonlinear Process Design Rule Scaling", Proceedings of the 20th Anniversary Conference on Advanced Research in VLSI, Mar. 1999, 14 pages, IEEE Computer Society, Los Alamitos, California.

* cited by examiner

*Primary Examiner* — Naum B Levin
(74) *Attorney, Agent, or Firm* — Brandon C. Kennedy; Steven Meyers; Kennedy Lenart Spraggins LLP (57) ABSTRACT

Generating place and route abstracts, including: for each of a plurality of cells, generating a wire diagram; for each generated wire diagram, generating, in dependence upon a cell architecture layout, a cell architecture description; for each cell architecture description: generating, in dependence upon the wire diagrams and the cell architecture descriptions, a blockage map specifying locations where the placement of cells or routing structures is prohibited; and generating, in dependence upon the blockage maps and one or more design rules, a library exchange format ('LEF') abstract.

15 Claims, 4 Drawing Sheets

GENERATING PLACE AND ROUTE ABSTRACTS

BACKGROUND

The present disclosure is generally related to methods, apparatuses, and products for generating place and route abstracts.

DESCRIPTION OF RELATED ART

Node-to-node power, performance, and area scaling are the primary parameters that determine the competitiveness of a technology definition. In older technology nodes, chip-level area scaling could be accurately estimated as the square of a linear scale factor applied equally to all critical design rules. In advanced technology nodes, this simplistic area scaling outlook fails to produce accurate results for several reasons. First, only the primary pitches scale by the chosen scale factor. Critical two-dimensional rules, such as metal-past-via extension and metal tip-to-side, do not scale by the same amount or, in extreme cases, are anti-correlated to the pitch scale factor. Second, new technology elements such as fin-FET, local interconnect, or self-aligned vias make scaling predictions very difficult. Third, new patterning techniques (e.g. multiple exposure patterning or extreme ultraviolet lithography ('EUV') and their associated constraints (e.g. two color mapping or preferred orientation wiring) pose a new scaling challenge for every technology node. As such, it can be beneficial to empirically determine achievable block level scaling by designing a representative set of logic cells and running them through a place-and-route experiment, which can be very time consuming.

SUMMARY

Methods, apparatuses, and products for generating place and route abstracts, including: for each of a plurality of cells, generating a wire diagram; for each generated wire diagram, generating, in dependence upon a cell architecture layout, a cell architecture description; for each cell architecture description: generating, in dependence upon the wire diagrams and the cell architecture descriptions, a blockage map specifying locations where the placement of cells or routing structures is prohibited; and generating, in dependence upon the blockage maps and one or more design rules, a library exchange format ('LEF') abstract.

The foregoing and other objects, features and advantages described herein will be apparent from the following more particular descriptions of example embodiments as illustrated in the accompanying drawings wherein like reference numbers generally represent like parts of example embodiments.

DETAILED DESCRIPTION OF EXAMPLE EMBODIMENTS

Figure 1:
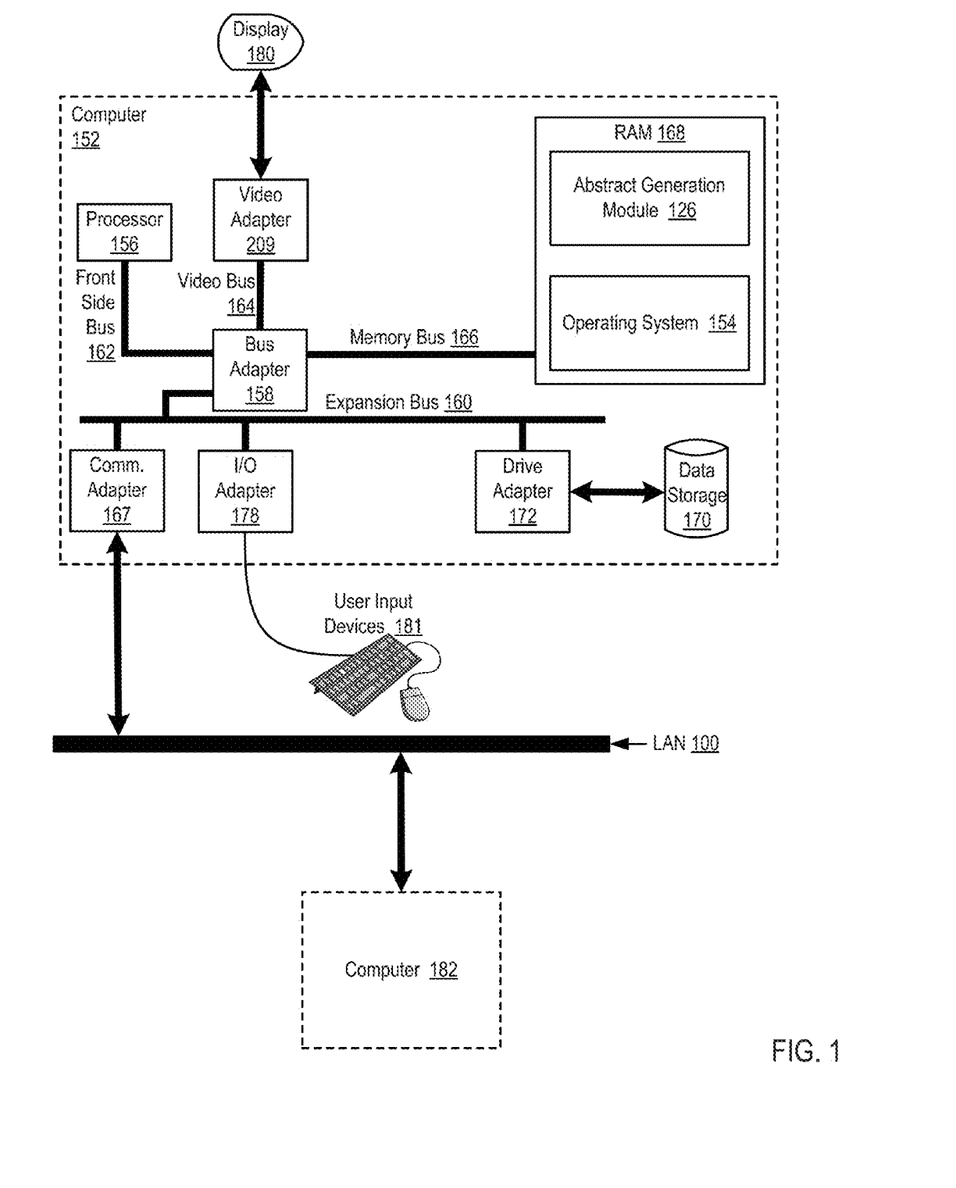
FIG. 1 sets forth a block diagram of automated computing machinery comprising an example computer useful in generating place and route abstracts.

Example methods, apparatus, and products for generating place and route abstracts in accordance with embodiments described herein with reference to the accompanying drawings, beginning with FIG. 1. FIG. 1 sets forth a block diagram of automated computing machinery comprising an example computer (152) useful in generating place and route abstracts according to embodiments described herein. The computer (152) of FIG. 1 includes at least one computer processor (156) or 'CPU' as well as random access memory (168) ('RAM') which is connected through a high speed memory bus (166) and bus adapter (158) to processor (156) and to other components of the computer (152).

Stored in RAM (168) is an abstract generation module (126), a module of computer program instructions for generating place and route abstracts. A place and route abstract is a data structure, such as a library exchange format ('LEF') file, that is a specification for representing the physical layout of an integrated circuit in an American Standard Code for Information Interchange ('ASCII') format. Such a place and route abstract can include design rules and abstract information about the cells of the integrated circuit. The 'place' information contained in a place and route abstract can include information describing the placement of all electronic components, circuitry, and logic elements in each cell. The 'route' information contained in a place and route abstract can include information describing the exact design of all the wires needed to connect the placed components, where the desired connections are implemented while following the rules and limitations of the manufacturing process.

The abstract generation module (126) may be configured to generate place and route abstracts by generating a wire diagram for each of a plurality of cells. Each cell, as the term is used here, is a group of transistors and interconnect structures that provides a logic function or other electronic function such as a storage function. So called 'standard' cells may provide basic logic functions (e.g., AND, OR, XOR, XNOR, inverters) or basic storage functions (e.g., a flipflop or latch), while more complicated cells may provide more intricate logic functions or storage functions. The plurality of cells may include a collection of cells such as, for example, all cells in a standard cell library. Such a standard cell library may be provided by a third party vendor, part of an open source project, or generated in other ways. A non-exhaustive list of such standard cell libraries can include, for example, the Synopsis DesignWare™ Logic Libraries, the ARM™ Standard Cell Library, the vsclib standard cell library, the wsclib standard cell library, and many others.

Each cell may be described by a cell schematic. The cell schematics may be embodied as representations of the cells that include information describing the components and the connections that make up a particular cell. The cell schematics may be generated through the use of computer aided design ('CAD') or electronic design automation ('EDA') programs. The cell schematics of a particular cell may be embodied, for example, as a very-large-scale integration ('VLSI') layout generated using the Magic VLSI Layout Tool, the Electric VLSI Design System, the Alliance CAD system, the CADENCE Custom IC Design Tools, and so on. Such a VLSI layout of a particular cell may be included, for example, in a Caltech Intermediate Form ('CIF') file, GDSII file, or the like.

Each wire diagram represents a simplified representation of a particular cell. The wire diagram for a particular cell can include, for example, the cell width, intra-cell wiring details, the number of pins in a particular cell, the location of the pins, and so on. As such, the wire diagram is a simplified representation of a cell that primarily depicts the electrical aspects of the cell. Such a wire diagram may be technology independent as the wire diagrams do not include technology-specific information such as layer types used, electrical connectivity between types, design rules, rules for mask generation, and rules for extracting netlists for circuit simulation, all of which may be contained separately from the wire diagram, for example, in a technology file.

Generating a wire diagram for each of a plurality of cells may be carried out, for example, by receiving a cell schematic for each of the plurality of cells in a standard cell library and extracting information from the cell schematic. Information to be extracted from the cell schematic can include, for example, the cell width, intra-cell wiring details, the location of pins in a particular cell, and any other details that are to be included in the wire diagram. Such information may be extracted from the cell schematic for a particular cell by processing one or more stream records contained in a GDSII file in embodiments where the cell schematic is embodied as a GDSII file. Each stream record can include information describing, for example, the boundary of a particular cell, details describing the geometries of paths in a particular cell, and so on. In such an example, one or more stream records contained in a GDSII file may be processed using electronic design automation (FDA') software including editors, viewers, or other utilities used to convert the binary format of the GDSII files to a human readable ASCII format. In such a way, information describing the boundaries of the cell and the location of pins and paths within the cell may be extracted from the cell schematic and used to construct a wire diagram associated with a particular cell schematic.

The abstract generation module (126) may be further configured to generate place and route abstracts by generating, in dependence upon one or more cell architecture layouts for a cell, one or more cell architecture descriptions. The cell architecture layouts may be embodied as representations of the cells that include information describing the physical layout details of a particular cell. The cell architecture layouts can include, for example, the location of various pins on one or more substrate layers, the locations of one or more vias that form electrical connections between pins on different substrate layers, and so on. In such a way, the cell architecture layouts represent detailed physical descriptions of a particular cell—while the cell schematic represent a less detailed, schematic view of a particular cell. For example, the cell architecture layouts can include precise information describing the layout of various items on a plurality of substrate layers while the cell schematic may only identify the components in a cell and their physical connections, without more detailed information describing the plurality of substrate layers that form a particular cell.

Readers will appreciate that a plurality of cell architecture layouts may exist for each of the generated wire diagrams, as the particular cell associated with a particular wire diagram may be physically constructed in many ways. For example, if a particular wire diagram specifies that a first pin in coupled to a second pin, the first pin and the second pin may reside on the same substrate layer, resulting in a first cell architecture layout depicting the two pins on a single layer. Alternatively, the first pin and the second pin may reside on different substrate layers and may be connected by a via, resulting in a second cell architecture layout depicting the two pins on a different substrate layers for the same cell that is associated with the same wire diagram.

The cell architecture layouts are utilized to generate cell architecture descriptions for each of the generated wire diagrams. The cell architecture descriptions may be embodied, for example, as metadata describing the physical layout details of a particular cell. The cell architecture descriptions can include, for example, information describing the location of various pins on one or more substrate layers, information describing the locations of one or more vias that form electrical connections between pins on different substrate layers, information describing the cell height, information describing the width of a power rail, information describing the offset of an input pin and an output pin. As such, each cell architecture description is a textual description of a particular cell architecture layout. The cell architecture descriptions may be embodied, for example, as a table that includes a list of parameters and values for each cell architecture layout.

Generating one or more cell architecture descriptions in dependence upon one or more cell architecture layouts for a cell may be carried out, for example, by converting the information contained in the cell architecture layout for each cell into a predetermined textual format for the cell architecture descriptions. Each cell architecture description may be embodied in a predetermined format that includes predetermined fields, such as the cell architecture descriptions depicted below in Table 1 that include a predetermined set of parameters. In such an example, each of the predetermined fields contained in the cell architecture description can map to information contained in the cell architecture layouts. Generating one or more cell architecture descriptions in dependence upon one or more cell architecture layouts for a cell may therefore be carried out by identifying each of the predetermined fields contained in the cell architecture description, identifying information contained in the cell architecture layouts that maps to each of the predetermined fields contained in the cell architecture description, reading such information contained in the cell architecture layouts from the cell architecture layouts, and writing the information to the corresponding field in a cell architecture layout.

The abstract generation module (126) may be further configured to generate place and route abstracts by generating, in dependence upon the wire diagrams and the cell architecture descriptions, a blockage map for each of cell architecture description. The blockage map may be embodied as a data structure that includes information specifying locations where the placement of electrical components or routing structures is restricted. The placement of electrical components or routing structures in certain locations may be restricted, for example, to maintain distance requirements between electrical components, to avoid placing cells in a way that interferes with routing requirements, and so on. Likewise, the placement of routing structures in certain locations may be prohibited, for example, to maintain distance requirements between routing structures, to avoid placing routing structures at locations that are blocked by other electrical components, and so on.

Generating a blockage map for each cell architecture description may be carried out through the use of one or more blockage rules that specify information such as the minimum distances needed between two or more types of components, the minimum number of vertical layers that must separate two or more components, and so on. Consider an example in which the blockage rules specify a predetermined pin buffer distance representing the minimum distance required between a pin and all other components (other than routing structures such as a track) on a particular layer of a cell. In such an example, generating a blockage map for a particular cell architecture description may be carried out by retrieving the location of a particular pin that is specified in the particular cell architecture description and identifying an area that is defined by a circle that is centered on the pin location with a radius that is equal to the predetermined pin buffer distance as being a restricted area—an area where the placement of components other than routing structures is prohibited.

The abstract generation module (126) may be further configured to generate place and route abstracts by, for each of the cell architecture descriptions, generating a place and route abstract in dependence upon the blockage maps and one or more design rules. Each place and route abstract may be embodied as a LEF file that is a specification for representing the physical layout of an integrated circuit in ASCII format. Such a place and route abstract can include a technology description describing the layers available in the technology, the design rules that affect operation of a cell (e.g., minimum width and separation of wells), routing related information such as the routing pitch, direction for metal tracks, and so on. The place and route abstract can also include information describing the geometries of each cell, including the shape and size of a cell as defined by its boundaries, the location of pins, the layers that pins are located upon, descriptions of obstructions that prohibit the passage of routing tracks on a particular layer, and so on.

Also stored in RAM (168) is an operating system (154). Operating systems useful generating place and route abstracts according to embodiments described herein include UNIX™ Linux™ Microsoft XP™ AIX™ IBM's i5/OS™ and others as will occur to those of skill in the art. The operating system (154) and the abstract generation module (126) in the example of FIG. 1 are shown in RAM (168), but many components of such software typically are stored in non-volatile memory also, such as, for example, on a disk drive (170).

The computer (152) of FIG. 1 includes disk drive adapter (172) coupled through expansion bus (160) and bus adapter (158) to processor (156) and other components of the computer (152). Disk drive adapter (172) connects non-volatile data storage to the computer (152) in the form of disk drive (170). Disk drive adapters useful in computers for generating place and route abstracts according to embodiments described herein include Integrated Drive Electronics ('IDE') adapters, Small Computer System Interface (SCSI') adapters, and others as will occur to those of skill in the art. Non-volatile computer memory also may be implemented for as an optical disk drive, electrically erasable programmable read-only memory (so-called 'EEPROM' or 'Flash' memory), RAM drives, and so on, as will occur to those of skill in the art.

The example computer (152) of FIG. 1 includes one or more input/output ('I/O') adapters (178). I/O adapters implement user-oriented input/output through, for example, software drivers and computer hardware for controlling output to display devices such as computer display screens, as well as user input from user input devices (181) such as keyboards and mice. The example computer (152) of FIG. 1 includes a video adapter (209), which is an example of an I/O adapter specially designed for graphic output to a display device (180) such as a display screen or computer monitor. Video adapter (209) is connected to processor (156) through a high speed video bus (164), bus adapter (158), and the front side bus (162), which is also a high speed bus.

The example computer (152) of FIG. 1 includes a communications adapter (167) for data communications with other computers (182) and for data communications with a data communications network (100). Such data communications may be carried out serially through RS-232 connections, through external buses such as a Universal Serial Bus ('USB'), through data communications networks such as IP data communications networks, and in other ways as will occur to those of skill in the art. Communications adapters implement the hardware level of data communications through which one computer sends data communications to another computer, directly or through a data communications network. Examples of communications adapters useful for generating place and route abstracts according to embodiments described herein include modems for wired dial-up communications, Ethernet (IEEE 802.3) adapters for wired data communications network communications, and 802.11 adapters for wireless data communications network communications.

Figure 2:
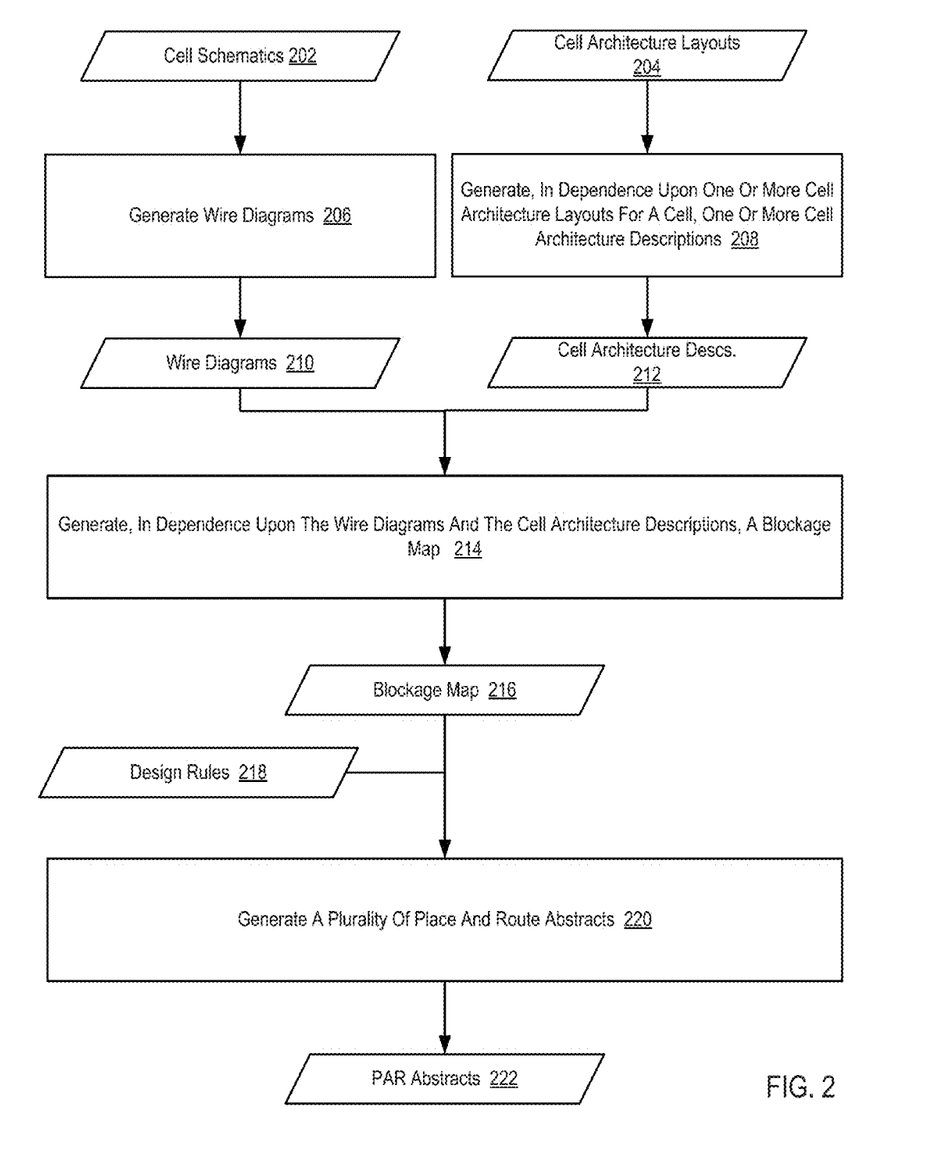
FIG. 2 sets forth a flow chart illustrating an example method for generating place and route abstracts.

For further explanation, FIG. 2 sets forth a flow chart illustrating an example method for generating a place and route abstracts. A place and route abstract is a data structure, such as a LEF file, that is a specification for representing the physical layout of an integrated circuit in ASCII format. Such a place and route abstract can include design rules and abstract information about the cells of the integrated circuit. The 'place' information contained in a place and route abstract can include information describing the placement of all electronic components, circuitry, and logic elements in each cell. The 'route' information contained in a place and route abstract can include information describing the exact design of all the wires needed to connect the placed components, where the desired connections are implemented while following the rules and limitations of the manufacturing process. An abstract view of one or more cells can include information such as, for example, a cell name, a cell orientation, cell boundaries, pin names, pin locations, a pin type (e.g., input/output), the location of tracks and vias, and so on.

The example method depicted in FIG. 2 includes generating (206) a wire diagram (210) for each of a plurality of cells. Each cell, as the term is used here, is a group of transistors and interconnect structures that provides a logic function or other electronic function such as a storage function. So called 'standard' cells may provide basic logic functions (e.g., AND, OR, XOR, XNOR, inverters) or basic storage functions (e.g., a flipflop or latch), while more complicated cells may provide more intricate logic functions or storage functions. In the example method depicted in FIG. 2, the plurality of cells may include a collection of cells such as, for example, all cells in a standard cell library. Such a standard cell library may be provided by a third party vendor, part of an open source project, or generated in other ways. A non-exhaustive list of such standard cell libraries can include, for example, the Synopsis DesignWare™ Logic Libraries, the ARM™ Standard Cell Library, the vsclib standard cell library, the wsclib standard cell library, and many others.

In the example method depicted in FIG. 2, each cell may be described by a cell schematic (202). The cell schematics (202) of FIG. 2 may be embodied as representations of the cells that include information describing the components and the connections that make up a particular cell. The cell schematics (202) may be generated through the use of computer aided design ('CAD') or electronic design automation ('EDA') programs. The cell schematics (202) of a particular cell may be embodied, for example, as a VLSI layout generated using the Magic VLSI Layout Tool, the Electric VLSI Design System, the Alliance CAD system, the CADENCE Custom IC Design Tools, and so on. Such a VLSI layout of a particular cell may be included, for example, in a CIF file, GDSII file, or the like.

In the example method depicted in FIG. 2, each wire diagram (210) represents a simplified representation of a particular cell. The wire diagram (210) for a particular cell can include, for example, the cell width, intra-cell wiring details, the number of pins in a particular cell, the location of the pins, and so on. As such, the wire diagram (210) is a simplified representation of a cell that primarily depicts the electrical aspects of the cell. Such a wire diagram (210) may be technology independent as the wire diagrams (210) do not include technology-specific information such as layer types used, electrical connectivity between types, design rules, rules for mask generation, and rules for extracting netlists for circuit simulation, all of which may be contained separately from the wire diagram (210), for example, in a technology file.

In the example method depicted in FIG. 2, generating (206) a wire diagram (210) for each of a plurality of cells may be carried out, for example, by receiving a cell schematic (202) for each of the plurality of cells in a standard cell library and extracting information from the cell schematic (202). Information to be extracted from the cell schematic (202) can include, for example, the cell width, intra-cell wiring details, the location of pins in a particular cell, and any other details that are to be included in the wire diagram (210). In the example method depicted in FIG. 2, such information may be extracted from the cell schematic (202) for a particular cell by processing one or more stream records contained in a GDSII file in embodiments where the cell schematic (202) is embodied as a GDSII file. Each stream record can include information describing, for example, the boundary of a particular cell, details describing the geometries of paths in a particular cell, and so on. In such an example, one or more stream records contained in a GDSII file may be processed using electronic design automation ('EDA') software including editors, viewers, or other utilities used to convert the binary format of the GDSII files to a human readable ASCII format. In such a way, information describing the boundaries of the cell and the location of pins and paths within the cell may be extracted from the cell schematic (202) and used to construct a wire diagram (210) associated with a particular cell schematic (202).

The example method depicted in FIG. 2 also includes generating (208), in dependence upon one or more cell architecture layouts (204) for a cell, one or more cell architecture descriptions (212). The cell architecture layouts (204) depicted in FIG. 2 may be embodied as representations of the cells that include information describing the physical layout details of a particular cell. The cell architecture layouts (204) can include, for example, the location of various pins on one or more substrate layers, the locations of one or more vias that form electrical connections between pins on different substrate layers, and so on. In such a way, the cell architecture layouts (204) represent detailed physical descriptions of a particular cell—while the cell schematic (202) represent a less detailed, schematic view of a particular cell. For example, the cell architecture layouts (204) can include precise information describing the layout of various items on a plurality of substrate layers while the cell schematic (202) may only identify the components in a cell and their physical connections, without more detailed information describing the plurality of substrate layers that form a particular cell.

In the example method depicted in FIG. 2, a plurality of cell architecture layouts (204) may exist for each of the generated wire diagrams (210), as the particular cell associated with a particular wire diagram (210) may be physically constructed in many ways. For example, if a particular wire diagram (210) specifies that a first pin in coupled to a second pin, the first pin and the second pin may reside on the same substrate layer, resulting in a first cell architecture layout (204) depicting the two pins on a single layer. Alternatively, the first pin and the second pin may reside on different substrate layers and may be connected by a via, resulting in a second cell architecture layout (204) depicting the two pins on a different substrate layers for the same cell that is associated with the same wire diagram (210).

In the example method depicted in FIG. 2, the cell architecture layouts (204) are utilized to generate (208) cell architecture descriptions (212) for each of the generated wire diagrams (210). The cell architecture descriptions (212) of FIG. 2 may be embodied, for example, as metadata describing the physical layout details of a particular cell. The cell architecture descriptions (212) can include, for example, information describing the location of various pins on one or more substrate layers, information describing the locations of one or more vias that form electrical connections between pins on different substrate layers, information describing the cell height, information describing the width of a power rail, information describing the offset of an input pin and an output pin. As such, each cell architecture description (212) is a textual description of a particular cell architecture layout (204). The cell architecture descriptions (212) may be embodied, for example, as a table that includes a list of parameters and values for each cell architecture layout (204). For example, the cell architecture descriptions (212) may be embodied as the following table:

TABLE 1

| Cell Architecture Description | | | | | |
|---|---|---|---|---|---|
| Parameter | CAD1 | CAD2 | CAD3 | CAD4 | CAD5 |
| Cell Height | 9 | 9 | 9 | 9 | 9 |
| Intra-cell X-dir routing layer | M0 | M1 | M0&M1 | M1 | M2 |
| Power Rail Width (M0/M1/M2) | 50/100/100 | 50/100/100 | 0/50/100 | 0/50/100 | 0/50/100 |
| Input Pin Offset | 0 nm | 1 nm | 0 nm | 0 nm | 0 nm |
| Output Pin Offset | −8 nm | 0 nm | 0 nm | −8 nm | −8 nm |

In the example depicted in Table 1, five cell architecture descriptions (212) are included and labelled as CAD1, CAD2, CAD3, CAD4, and CAD5. Values for five parameters are included for each of the five cell architecture descriptions (212). The parameters include offset values for input and output pins, the width of various power rails, the cell height, and an identification of an intra-cell routing layer. Readers will appreciate that the table included above is only for explanatory purposes, and that cell architecture descriptions (212) can be embodied in other formats with information for additional parameters.

In the example method depicted in FIG. 2, generating (208) one or more cell architecture descriptions (212) in dependence upon one or more cell architecture layouts (204) for a cell may be carried out, for example, by converting the information contained in the cell architecture layout (204) for each cell into a predetermined textual format for the cell architecture descriptions (212). In the example method depicted in FIG. 2, each cell architecture description (212) may be embodied in a predetermined format that includes predetermined fields, such as the cell architecture descriptions depicted in Table 1 that include a predetermined set of parameters. In such an example, each of the predetermined fields contained in the cell architecture description (212) can map to information contained in the cell architecture layouts (204). Generating (208) one or more cell architecture descriptions (212) in dependence upon one or more cell architecture layouts (204) for a cell may therefore be carried out by identifying each of the predetermined fields contained in the cell architecture description (212), identifying information contained in the cell architecture layouts (204) that maps to each of the predetermined fields contained in the cell architecture description (212), reading such information contained in the cell architecture layouts (204) from the cell architecture layouts (204), and writing the information to the corresponding field in a cell architecture layout (204).

The example method depicted in FIG. 2 also includes generating (214), in dependence upon the wire diagrams (210) and the cell architecture descriptions (212), a blockage map (216) for each of cell architecture description (212). The blockage map (216) depicted in FIG. 2 may be embodied as a data structure that includes information specifying locations where the placement of electrical components or routing structures is restricted. The placement of electrical components or routing structures in certain locations may be restricted, for example, to maintain distance requirements between electrical components, to avoid placing cells in a way that interferes with routing requirements, and so on. Likewise, the placement of routing structures in certain locations may be prohibited, for example, to maintain distance requirements between routing structures, to avoid placing routing structures at locations that are blocked by other electrical components, and so on.

The blockage map (216) depicted in FIG. 2 may also information specifying a location and a size of one or more input pins and one or more output pins. The location of an input pin and the location of an output pin may be embodied, for example, using a coordinate system. The size of an input pin and the size of an output pin may be embodied, for example, as a radius, as a diameter, and so on.

In the example method depicted in FIG. 2, generating (214) a blockage map (216) for each of cell architecture description (212) may be carried out through the use of one or more blockage rules that specify information such as the minimum distances needed between two or more types of components, the minimum number of vertical layers that must separate two or more components, and so on. Consider an example in which the blockage rules specify a predetermined pin buffer distance representing the minimum distance required between a pin and all other components (other than routing structures such as a track) on a particular layer of a cell. In such an example, generating (214) a blockage map (216) for a particular cell architecture description (212) may be carried out by retrieving the location of a particular pin that is specified in the particular cell architecture description (212) and identifying an area that is defined by a circle that is centered on the pin location with a radius that is equal to the predetermined pin buffer distance as being a restricted area—an area where the placement of components other than routing structures is prohibited.

The example method depicted in FIG. 2 also includes, for each of the cell architecture descriptions (212), generating (220) a place and route abstract (222) in dependence upon the blockage maps (216) and one or more design rules (218). Each place and route abstract (222) may be embodied as a LEF file that is a specification for representing the physical layout of an integrated circuit in ASCII format. Such a place and route abstract (222) can include a technology description describing the layers available in the technology, the design rules that affect operation of a cell (e.g., minimum width and separation of wells), routing related information such as the routing pitch, direction for metal tracks, and so on. The place and route abstract (222) can also include information describing the geometries of each cell, including the shape and size of a cell as defined by its boundaries, the location of pins, the layers that pins are located upon, descriptions of obstructions that prohibit the passage of routing tracks on a particular layer, and so on.

In the example method depicted in FIG. 2, generating (220) a place and route abstract (222) is done in dependence upon the blockage maps (216) and one or more design rules (218). The design rules (218) depicted in FIG. 2 may be embodied as a data structure that includes a series of parameters provided by semiconductor manufacturers that enable the designer to verify the correctness of a mask set. Such design rules (218) may be specific to a particular semiconductor manufacturing process and may set forth certain geometric and connectivity restrictions to ensure sufficient margins to account for variability in semiconductor manufacturing processes. Examples of such design rules (218) can include a width rule specifying the minimum width of any shape in the design, a spacing rule specifying the minimum distance between two adjacent objects, a two layer rule specifying a relationship that must exist between two layers, and so on. In the example method depicted in FIG. 2, generating (220) a place and route abstract (222) in dependence upon the blockage maps (216) and one or more design rules (218) may therefore be carried out, for example, such that cells represented by a particular place and route abstract (222) adhere to the placement limitations set forth by the blockage maps (216) and the one or more design rules (218).

Figure 3:
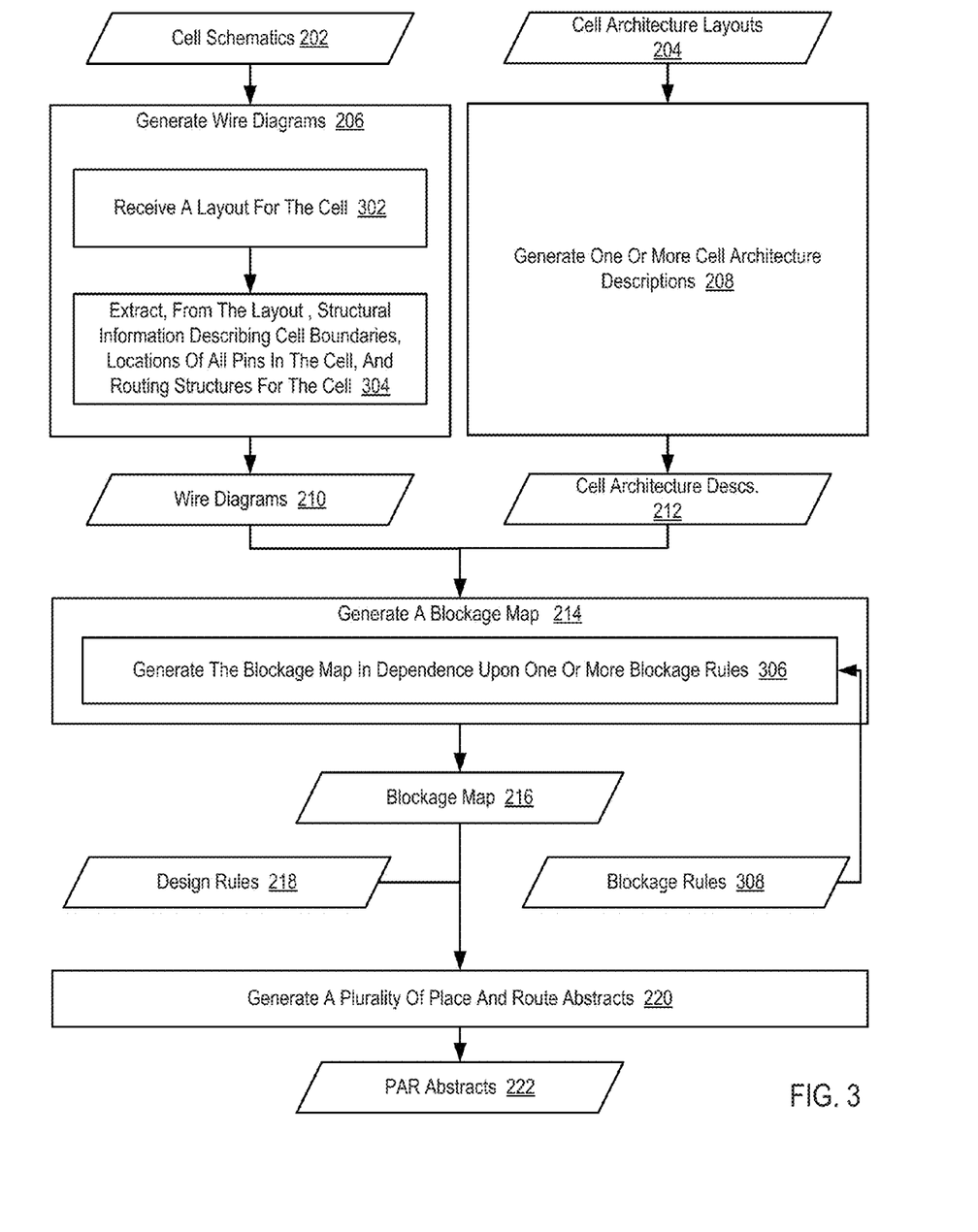
FIG. 3 sets forth a flow chart illustrating an additional example method for generating place and route abstracts.

For further explanation, FIG. 3 sets forth a flow chart illustrating a further example method for generating place and route abstracts. The example method depicted in FIG. 3 is similar to the example method depicted in FIG. 2, as the example method depicted in FIG. 3 also includes generating (206) a wire diagram (210) for each of a plurality of cells, generating (208) one or more cell architecture descriptions (212) in dependence upon one or more cell architecture layouts (204) for a cell, generating (214) a blockage map (216) for each of the cell architecture descriptions (212) in dependence upon the wire diagrams (210) and the cell architecture descriptions (212), and generating (220) a place and route abstract (222) in dependence upon the blockage maps (216) and one or more design rules (218).

In the example method depicted in FIG. 3, generating (206) a wire diagram (210) for each of a plurality of cells includes receiving (302) a layout for the cell. The layout for the cell may be embodied as a representation of the cell that includes information describing the components and the connections that make up a particular cell. Such a layout may be generated through the use of computer aided design ('CAD') or electronic design automation ('EDA') programs and may be embodied, for example, as a VLSI layout generated using the Magic VLSI Layout Tool, the Electric VLSI Design System, the Alliance CAD system, the CADENCE Custom IC Design Tools, and so on. Such a VLSI layout of a particular cell may be included, for example, in a CIF file, GDSII file, or the like.

In the example method depicted in FIG. 3, the layout for a cell may be received (302), for example, by receiving layouts of all cells in a standard cell library. Such a standard cell library may be provided by a third party vendor, part of an open source project, or generated in other ways. A non-exhaustive list of such standard cell libraries can include, for example, the Synopsis DesignWare™ Logic Libraries, the ARM™ Standard Cell Library, the vsclib standard cell library, the wsclib standard cell library, and many others.

In the example method depicted in FIG. 3, generating (206) a wire diagram (210) for each of a plurality of cells also includes extracting (304), from the layout for the cell, structural information describing cell boundaries for the cell, locations of all pins in the cell, and routing structures for the cell. In the example method depicted in FIG. 3, the structural information describing cell boundaries for the cell, the locations of all pins in the cell, and the routing structures for the cell may be extracted (304), for example, by processing one or more stream records contained in a GDSII file in embodiments where the layout for the cell is embodied as a GDSII file. Each stream record can include information describing, for example, the boundary of a particular cell, details describing the geometries of paths in a particular cell, and so on. In such an example, one or more stream records contained in a GDSII file may be processed using electronic design automation ('EDA') software including editors, viewers, or other utilities used to convert the binary format of the GDSII files to a human readable ASCII format. In such a way, information describing the structural information describing cell boundaries for the cell, the locations of all pins in the cell, and the routing structures for the cell may be extracted from the cell layout and used to construct a wire diagram (210) associated with a particular cell layout.

In the example method depicted in FIG. 3, generating (214) a blockage map (216) for each of the cell architecture descriptions (212) in dependence upon the wire diagrams (210) and the cell architecture descriptions (212) further comprises generating (306) the blockage map (216) in dependence upon one or more blockage rules (308). In the example method depicted in FIG. 3, the one or more blockage rules (308) specify information such as the minimum distances needed between two or more types of components, the minimum number of vertical layers that must separate two or more components, and so on. Consider an example in which the one or more blockage rules (308) specify a predetermined pin buffer distance representing the minimum distance required between a pin and all other components (other than routing structures such as a track) on a particular layer of a cell. In such an example generating (306) the blockage map (216) in dependence upon one or more blockage rules (308) may be carried out by retrieving the location of a particular pin that is specified in the particular cell architecture description (212) and identifying an area that is defined by a circle that is centered on the pin location with a radius that is equal to the predetermined pin buffer distance as being a restricted area—an area where the placement of components other than routing structures is prohibited.

Figure 4:
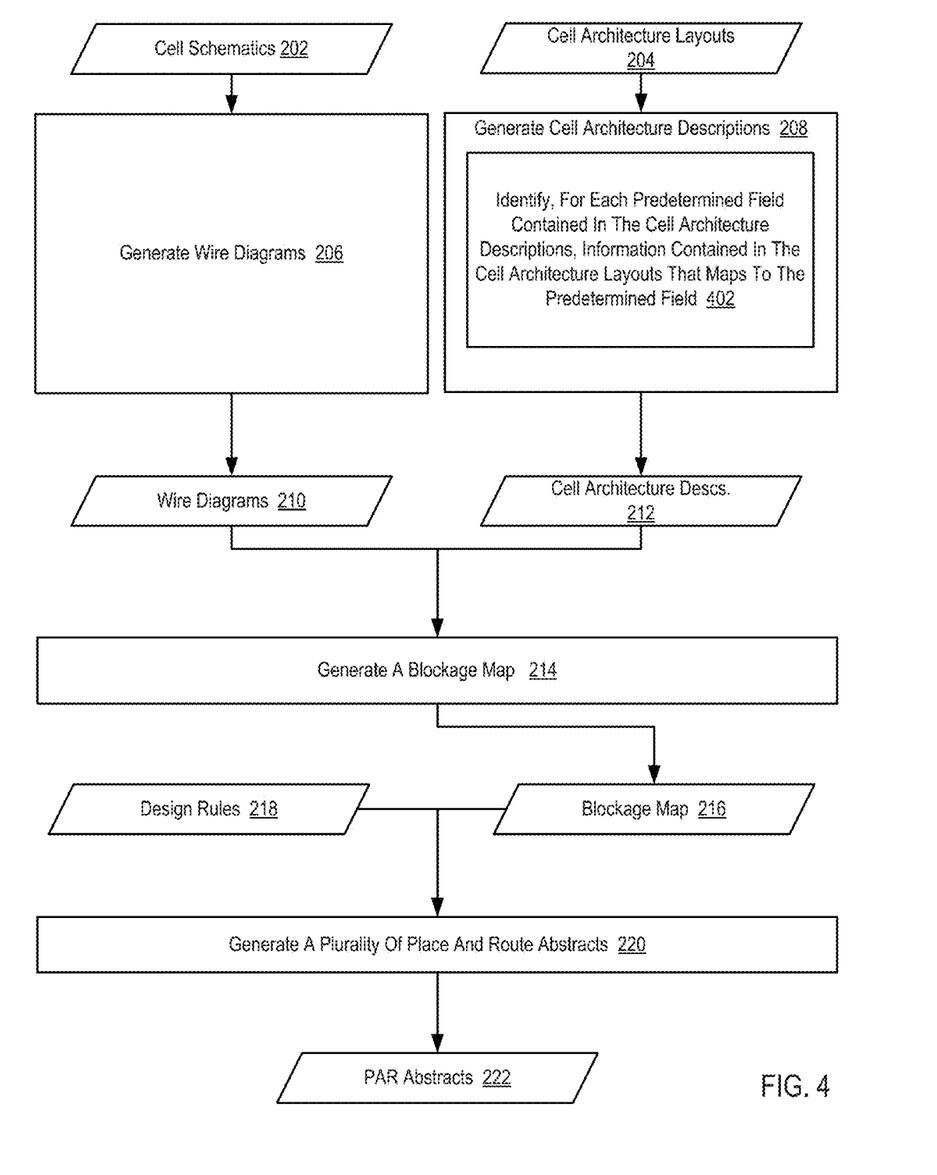
FIG. 4 sets forth a flow chart illustrating an additional example method for generating place and route abstracts.

For further explanation, FIG. 4 sets forth a flow chart illustrating a further example method for generating place and route abstracts. The example method depicted in FIG. 4 is similar to the example method depicted in FIG. 2, as the example method depicted in FIG. 4 also includes generating (206) a wire diagram (210) for each of a plurality of cells, generating (208) one or more cell architecture descriptions (212) in dependence upon one or more cell architecture layouts (204) for a cell, generating (214) a blockage map (216) for each of the cell architecture descriptions (212) in dependence upon the wire diagrams (210) and the cell architecture descriptions (212), and generating (220) a place and route abstract (222) in dependence upon the blockage maps (216) and one or more design rules (218).

In the example method depicted in FIG. 4, generating (208) one or more cell architecture descriptions (212) in dependence upon one or more cell architecture layouts (204) for a cell can also include identifying (402), for each predetermined field contained in the cell architecture descriptions (212), information contained in the cell architecture layouts (204) that maps to the predetermined field. In the example method depicted in FIG. 4, the cell architecture descriptions (212) may be embodied as data structures that include predetermined fields or parameters such as, for example, cell height, cell width, the number of pins in a cell, the location of each pin, the width of tracks on the cell, and so on. Likewise, the cell architecture layouts (204) may be embodied as a data structure that includes information in a standardized format, such that parameters that are commonly used to describe certain information about a cell are identified by known identifiers. For example, the cell architecture layouts (204) may be generated using a standardized format where the cell height, cell width, the number of pins in a cell, the location of each pin, the width of tracks on the cell, and other information is identified using uniform identifiers, regardless of the particular cell that is described by a particular cell architecture layout (204). As such, a mapping may be generated by a system administrator, system designer, or other entity, where the mapping correlates fields contained in the cell architecture descriptions (212) to fields contained in the information contained in the cell architecture layouts (204). Such a mapping may be utilized, for example, to read data from the cell architecture layouts (204) and write such data to a corresponding field in the cell architecture descriptions (212).

Example embodiments described herein are described largely in the context of a fully functional computer system for generating place and route abstracts. Readers of skill in the art will recognize, however, that the present disclosure also may be embodied in a computer program product disposed upon computer readable storage media for use with any suitable data processing system. Such computer readable storage media may be any storage medium for machine-readable information, including magnetic media, optical media, or other suitable media. Examples of such media include magnetic disks in hard drives or diskettes, compact disks for optical drives, magnetic tape, and others as will occur to those of skill in the art. Persons skilled in the art will immediately recognize that any computer system having suitable programming means will be capable of executing the steps of the method as embodied in a computer program product. Persons skilled in the art will recognize also that, although some of the example embodiments described in this specification are oriented to software installed and executing on computer hardware, nevertheless, alternative embodiments implemented as firmware or as hardware are well within the scope of the present disclosure.

Embodiments described herein may be a system, a method, and/or a computer program product. The computer program product may include a computer readable storage medium (or media) having computer readable program instructions thereon for causing a processor to carry out aspects described herein.

The computer readable storage medium can be a tangible device that can retain and store instructions for use by an instruction execution device. The computer readable storage medium may be, for example, but is not limited to, an electronic storage device, a magnetic storage device, an optical storage device, an electromagnetic storage device, a semiconductor storage device, or any suitable combination of the foregoing. A non-exhaustive list of more specific examples of the computer readable storage medium includes the following: a portable computer diskette, a hard disk, a random access memory (RAM), a read-only memory (ROM), an erasable programmable read-only memory (EPROM or Flash memory), a static random access memory (SRAM), a portable compact disc read-only memory (CD-ROM), a digital versatile disk (DVD), a memory stick, a floppy disk, a mechanically encoded device such as punch-cards or raised structures in a groove having instructions recorded thereon, and any suitable combination of the foregoing. A computer readable storage medium, as used herein, is not to be construed as being transitory signals per se, such as radio waves or other freely propagating electromagnetic waves, electromagnetic waves propagating through a waveguide or other transmission media (e.g., light pulses passing through a fiber-optic cable), or electrical signals transmitted through a wire.

Computer readable program instructions described herein can be downloaded to respective computing/processing devices from a computer readable storage medium or to an external computer or external storage device via a network, for example, the Internet, a local area network, a wide area network and/or a wireless network. The network may comprise copper transmission cables, optical transmission fibers, wireless transmission, routers, firewalls, switches, gateway computers and/or edge servers. A network adapter card or network interface in each computing/processing device receives computer readable program instructions from the network and forwards the computer readable program instructions for storage in a computer readable storage medium within the respective computing/processing device.

Computer readable program instructions for carrying out operations described herein may be assembler instructions, instruction-set-architecture (ISA) instructions, machine instructions, machine dependent instructions, microcode, firmware instructions, state-setting data, or either source code or object code written in any combination of one or more programming languages, including an object oriented programming language such as Smalltalk, C++ or the like, and conventional procedural programming languages, such as the "C" programming language or similar programming languages. The computer readable program instructions may execute entirely on the user's computer, partly on the user's computer, as a stand-alone software package, partly on the user's computer and partly on a remote computer or entirely on the remote computer or server. In the latter scenario, the remote computer may be connected to the user's computer through any type of network, including a local area network (LAN) or a wide area network (WAN), or the connection may be made to an external computer (for example, through the Internet using an Internet Service Provider). In some embodiments, electronic circuitry including, for example, programmable logic circuitry, field-programmable gate arrays (FPGA), or programmable logic arrays (PLA) may execute the computer readable program instructions by utilizing state information of the computer readable program instructions to personalize the electronic circuitry, in order to perform aspects described herein.

Embodiments are described herein with reference to flowchart illustrations and/or block diagrams of methods, apparatus (systems), and computer program products. It will be understood that each block of the flowchart illustrations and/or block diagrams, and combinations of blocks in the flowchart illustrations and/or block diagrams, can be implemented by computer readable program instructions.

These computer readable program instructions may be provided to a processor of a general purpose computer, special purpose computer, or other programmable data processing apparatus to produce a machine, such that the instructions, which execute via the processor of the computer or other programmable data processing apparatus, create means for implementing the functions/acts specified in the flowchart and/or block diagram block or blocks. These computer readable program instructions may also be stored in a computer readable storage medium that can direct a computer, a programmable data processing apparatus, and/or other devices to function in a particular manner, such that the computer readable storage medium having instructions stored therein comprises an article of manufacture including instructions which implement aspects of the function/act specified in the flowchart and/or block diagram block or blocks.

The computer readable program instructions may also be loaded onto a computer, other programmable data processing apparatus, or other device to cause a series of operational steps to be performed on the computer, other programmable apparatus or other device to produce a computer implemented process, such that the instructions which execute on the computer, other programmable apparatus, or other device implement the functions/acts specified in the flowchart and/or block diagram block or blocks.

The flowchart and block diagrams in the Figures illustrate the architecture, functionality, and operation of possible implementations of systems, methods, and computer program products according to various embodiments described herein. In this regard, each block in the flowchart or block diagrams may represent a module, segment, or portion of instructions, which comprises one or more executable instructions for implementing the specified logical function(s). In some alternative implementations, the functions noted in the block may occur out of the order noted in the figures. For example, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts or carry out combinations of special purpose hardware and computer instructions.

It will be understood from the foregoing description that modifications and changes may be made in various embodiments without departing from its true spirit. The descriptions in this specification are for purposes of illustration only and are not to be construed in a limiting sense. The scope of the present disclosure is limited only by the language of the following claims.

What is claimed is:

1. A method of generating place and route abstracts, the method comprising:
   for each of a plurality of cells, generating a wire diagram;
   for each generated wire diagram, generating, in dependence upon a cell architecture layout, one or more cell architecture descriptions comprising:
      identifying predetermined fields contained in the cell architecture descriptions; and
      identifying information contained in the cell architecture layout that maps to each of the predetermined fields contained in the cell architecture description; and
   for each cell architecture description:
      generating, in dependence upon the wire diagrams and the cell architecture descriptions, a blockage map specifying locations where the placement of cells or routing structures is prohibited and a location and a size of one or more input pins and one or more output pins; and
      generating, in dependence upon the blockage maps and one or more design rules, a place and route abstract.

2. The method of claim 1 wherein the plurality of cells include all cells in a standard cell library.

3. The method of claim 1 wherein generating the wire diagram further comprises:
   receiving a layout for the cell; and
   extracting, from the layout for the cell, structural information describing cell boundaries for the cell, locations of all pins in the cell, and routing structures for the cell.

4. The method of claim 1 wherein generating the blockage map further comprises generating the blockage map in dependence upon one or more blockage rules.

5. The method of claim 1 wherein the cell architecture descriptions comprise a table with a plurality of parameters and parameter values.

6. Apparatus for generating place and route abstracts, the apparatus comprising a computer processor, a computer memory operatively coupled to the computer processor, the computer memory having disposed within it computer program instructions that, when executed by the computer processor, cause the apparatus to carry out the steps of:

for each of a plurality of cells, generating a wire diagram;
for each generated wire diagram, generating, in dependence upon a cell architecture layout, one or more cell architecture descriptions comprising:
identifying predetermined fields contained in the cell architecture descriptions; and
identifying information contained in the cell architecture layout that maps to each of the predetermined fields contained in the cell architecture description; and
for each cell architecture description:
generating, in dependence upon the wire diagrams and the cell architecture descriptions, a blockage map specifying locations where the placement of cells or routing structures is prohibited and a location and a size of one or more input pins and one or more output pins; and
generating, in dependence upon the blockage maps and one or more design rules, a place and route abstract.

7. The apparatus of claim 6 wherein the plurality of cells include all cells in a standard cell library.

8. The apparatus of claim 6 wherein generating the wire diagram further comprises:
receiving a layout for the cell; and
extracting, from the layout for the cell, structural information describing cell boundaries for the cell, locations of all pins in the cell, and routing structures for the cell.

9. The apparatus of claim 6 wherein generating the blockage map further comprises generating the blockage map in dependence upon one or more blockage rules.

10. The apparatus of claim 6 wherein the cell architecture descriptions comprise a table with a plurality of parameters and parameter values.

11. A computer program product for generating place and route abstracts, the computer program product disposed upon a machine-readable non-transitory storage device, the computer program product comprising computer program instructions that, when executed by a machine, cause the machine to carry out the steps of:

for each of a plurality of cells, generating a wire diagram;
for each generated wire diagram, generating, in dependence upon a cell architecture layout, one or more cell architecture descriptions comprising:
identifying predetermined fields contained in the cell architecture descriptions; and
identifying information contained in the cell architecture layout that maps to each of the predetermined fields contained in the cell architecture description; and
for each cell architecture description:
generating, in dependence upon the wire diagrams and the cell architecture descriptions, a blockage map specifying locations where the placement of cells or routing structures is prohibited and a location and a size of one or more input pins and one or more output pins; and
generating, in dependence upon the blockage maps and one or more design rules, a place and route abstract.

12. The computer program product of claim 11 wherein the plurality of cells include all cells in a standard cell library.

13. The computer program product of claim 11 wherein generating the wire diagram further comprises:
receiving a layout for the cell; and
extracting, from the layout for the cell, structural information describing cell boundaries for the cell, locations of all pins in the cell, and routing structures for the cell.

14. The computer program product of claim 11 wherein generating the blockage map further comprises generating the blockage map in dependence upon one or more blockage rules.

15. The computer program product of claim 11 wherein the cell architecture descriptions comprise a table with a plurality of parameters and parameter values.

* * * * *